United States Patent
Lam et al.

(10) Patent No.: US 8,999,627 B1
(45) Date of Patent: Apr. 7, 2015

(54) MATCHED MULTIPLE CHARGED PARTICLE BEAM SYSTEMS FOR LITHOGRAPHIC PATTERNING, INSPECTION, AND ACCELERATED YIELD RAMP

(71) Applicant: Multibeam Corporation, Santa Clara, CA (US)

(72) Inventors: David K. Lam, Saratoga, CA (US); Kevin M. Monahan, Cupertino, CA (US); Theodore A. Prescop, San Jose, CA (US); Cong Tran, San Jose, CA (US)

(73) Assignee: Multibeam Corporation, Santa Clara, CA (US)

( * ) Notice: Subject to any disclaimer, the term of this patent is extended or adjusted under 35 U.S.C. 154(b) by 0 days.

(21) Appl. No.: 14/198,145

(22) Filed: Mar. 5, 2014

Related U.S. Application Data

(60) Provisional application No. 61/926,640, filed on Jan. 13, 2014, provisional application No. 61/772,671, filed on Mar. 5, 2013.

(51) Int. Cl.
  *G03F 7/20* (2006.01)
  *H01J 37/30* (2006.01)
  *G06F 17/50* (2006.01)

(52) U.S. Cl.
  CPC .............. *G03F 7/2051* (2013.01); *H01J 37/30* (2013.01); *G06F 17/5081* (2013.01); *G03F 7/2059* (2013.01); *Y10S 430/143* (2013.01)

(58) Field of Classification Search
  CPC . G03F 7/2051; G03F 7/2059; G06F 17/5081; H01J 37/30
  USPC .................................... 430/30, 296, 314, 942
  See application file for complete search history.

(56) References Cited

U.S. PATENT DOCUMENTS

| | | | |
|---|---|---|---|
| 7,570,796 B2 * | 8/2009 | Zafar et al. | 382/144 |
| 7,676,077 B2 * | 3/2010 | Kulkarni et al. | 382/144 |
| 8,592,102 B2 * | 11/2013 | Lin et al. | 430/5 |

* cited by examiner

*Primary Examiner* — Christopher Young
(74) *Attorney, Agent, or Firm* — Seth A. Horwitz

(57) ABSTRACT

The present application discloses methods, systems and devices for using charged particle beam tools to pattern and inspect a substrate. The inventors have discovered that it is highly advantageous to use write and inspection tools that share the same or substantially the same stage and the same or substantially the same designs for respective arrays of multiple charged particle beam columns, and that access the same design layout database to target and pattern or inspect features. By using design-matched charged particle beam tools, correlation of defectivity is preserved between inspection imaging and the design layout database. As a result, image-based defect identification and maskless design correction, of random and systematic errors, can be performed directly in the design layout database, enabling a fast yield ramp.

24 Claims, 18 Drawing Sheets

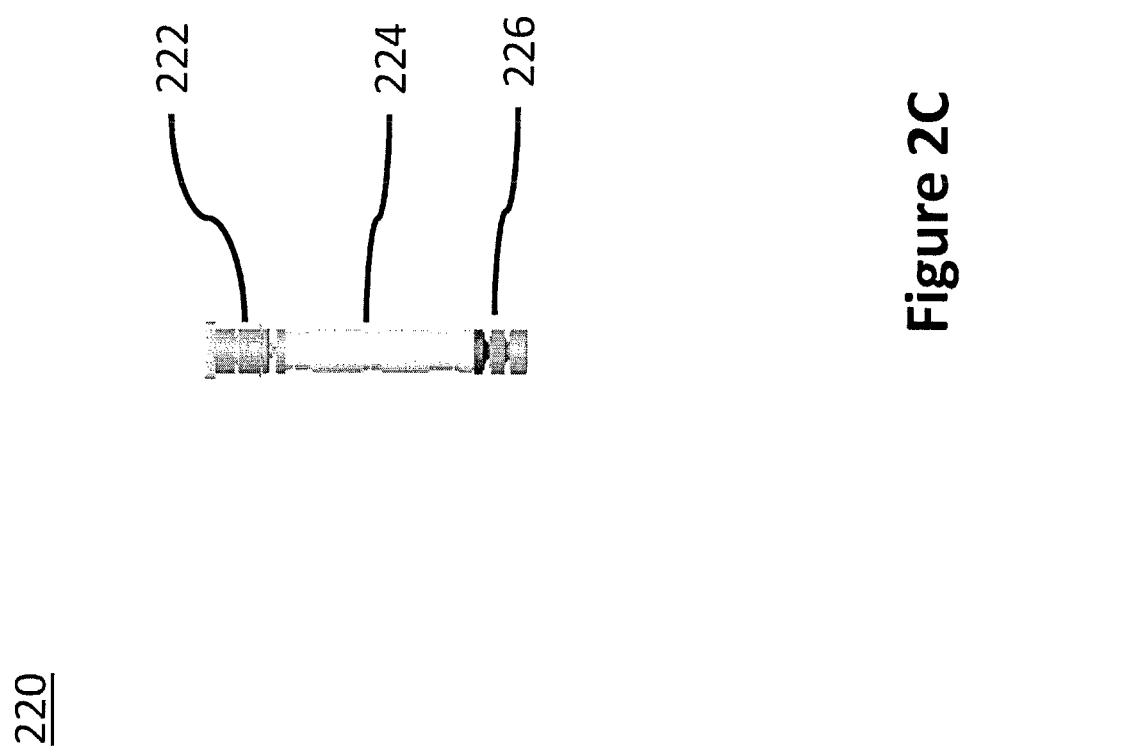

MATCHED MULTIPLE CHARGED PARTICLE BEAM SYSTEMS FOR LITHOGRAPHIC PATTERNING, INSPECTION, AND ACCELERATED YIELD RAMP

CROSS-REFERENCE

Priority is claimed from U.S. Provisional App. No. 61/926,640, filed Jan. 13, 2014, which is hereby incorporated by reference.

Priority is claimed from U.S. Provisional App. No. 61/772,671, filed Mar. 5, 2013, which is hereby incorporated by reference.

BACKGROUND

The present application relates to systems, devices and methods for substrate lithographic patterning and inspection using charged particle beams; and more particularly to patterning and inspecting a substrate using substantially the same miniature charged particle beam column arrays and substrate stages and the same design layout database, to thereby enable automatic modification of the design layout database to rapidly ramp yield.

Note that the points discussed below may reflect the hindsight gained from the disclosed inventions, and are not necessarily admitted to be prior art.

FIG. 2A shows an example of a wafer 200 being scanned by multiple electron beams 204 (e-beams) emitted by respective beam columns 206 (e-beam columns, see FIG. 2B). A patterned or unpatterned wafer 200 (or other substrate) is independently and simultaneously scanned by multiple columns 206 to either write or inspect the wafer 200. Columns 206 can be separately controlled—e.g., with different deflections and different blanking timings. (One of skill in the art will recognize that a wide variety of other control options are available per-column.) When writing a wafer 200 (or other substrate), the columns 206 emit electron beams 204 at a power level sufficient to change certain properties of a resist layer coated on the substrate so that after the resist is developed (in ways similar to developing a photographic film), etch steps can take place. When inspecting a wafer 200, the columns 206 emit electron beams 204 (generally at a lower power level than when writing) and detect an image of the substrate surface caused by the resulting scattered electrons. Individual columns 206 are able to target a portion 202 of the substrate surface with their respectively emitted beams 204.

In preferred embodiments, the array of electron beam columns 206 is stationary, the stage holding the wafer 200 moves back and forth, and the electron beam column 206 moves the beam 204 across the wafer 200 to write or to perform imaging (the latter during wafer inspection). The beam motion across the wafer 200 can be, for example, vector scanning to a target feature or "care-area" containing a target feature, and raster scanning across the target feature while writing or inspecting. Preferably, each column 206 has its own detector and control computer. Vector-raster scanning, care-areas, and use of multiple control computers local to respective columns are disclosed in U.S. patent application Ser. No. 14/085,768, which is incorporated herein by reference.

As mentioned above, after e-beams 204 write features to a substrate, the substrate needs to be treated with resist development followed by etch steps in order to complete the writing process. (Herein, the immediate results of e-beam writing are called "features", and continue to be called "features" throughout the lithography process, including after develop and/or etch.)

Herein, in some instances, develop and/or etch and/or other crucial steps are not explicitly described with respect to lithography and inspection. It will be understood by those skilled in the art that these steps (e.g., develop and etch) are performed when appropriate, and can be omitted from discussion for clarity of explanation. Further, a substrate being "written" by e-beams 204 means that the resist layer coating the substrate is exposed to the e-beams 204. Inspection (also referred to herein as "imaging") of features on the substrate always occurs AFTER at least a resist development step (sometimes referred to as just development), and can also occur after develop and etch.

Generally, in resist development, the resist coated substrate is immersed in or otherwise in contact with liquid chemical (resist developer solution), followed by rinsing. Certain properties of the resist are changed by e-beam exposure such that the e-beam-exposed area either becomes soluble in resist developer solution ("positive" resist, which is insoluble until exposed to e-beams) or becomes insoluble in resist developer solution ("negative" resist, which is soluble until exposed to e-beams). When a positive resist is exposed to e-beams, the unexposed portions remain insoluble, and will be left intact after the substrate is washed with resist developer solution. When a negative resist is exposed to e-beams, the unexposed portions remain soluble, and will be washed away by resist developer solution, leaving the e-beam-exposed portions intact.

As a result of resist development, a pattern will emerge on the substrate comprising many features written by the e-beam lithography tool. E-beams can then be used to inspect these features for defects. Inspection after development is also known as after-develop inspection (ADI).

Etch follows resist development. In etching, material exposed to the etch environment is removed, while material protected by developed resist is not etched. Inspection after etch is also known as after-etch inspection (AEI).

Both lithography (optical, e-beam and otherwise) and etch can introduce process-dependent defects to the patterned substrate. Generally, process-induced defects are defects introduced during wafer handling, resist spin and heating, lithography, resist development, etch, deposition, inspection, implantation, thermal processing, and chemical-mechanical polishing.

FIG. 2B shows an example of a wafer 200. The wafer 200 (or other substrate) is written or image data is gathered (beams are emitted) using columns 206 (columns 206 are shown via their center positions, represented here as plusses). Example die 208 size and column 206 center-to-center spacing 210 (column separation) are shown. A regular grid of columns 206 can use different spacing 210 in different (orthogonal) directions. Die 208 size and column separation 210 are not required to (and generally, will not) correspond. Column separation 210 generally corresponds to the substrate area 202 targetable by beams 204 emitted from respective columns 206.

Wafer 200 inspection using electron beams 202 can be made highly parallelized by using multiple electron beams 202. Electron beams 202 emitted by columns 206 in a multiple column 206 array can be independently and simultaneously scanned across the wafer 200 using electrostatic deflectors, preferably using distributed column control systems (e.g., local column control computers, as described hereinabove with respect to FIG. 2A).

The multiple column 206 array comprises electron beam columns 206 arranged in a regular grid. For example, column 206 arrays with center-to-center column spacing 210 of 30 mm×30 mm have been implemented, though other column spacings 210 (e.g., 24 mm×33 mm) can also be used.

A column 206 can be configured to scan a die 208 (IC), part of a die 208, or multiple dies 208 during inspection. Each die 208 can be scanned by one or more columns 206, depending on the column writing area 202 (the area to which the column can deflect its beam to obtain images, taking into account wafer stage movement).

FIG. 2C schematically shows an example of a miniature e-beam column 220 comprising an electron gun 222, including an electron source and electron gun lens; deflection assembly 224; and main lens 226. A miniature e-beam column 220 can also include, for example, deflectors, apertures, blankers, other electron-optical components, column control electronics, electron detectors or other sensors, and/or other elements for column 220 operation, maintenance, and testing.

FIG. 2D shows an example of a multi-column e-beam lithography (EBL) or e-beam inspection (EBI) system 230 (also referred to herein as an EBL or EBI tool). This e-beam system comprises an array 232 of miniature e-beam columns 220, as well as a wafer loading/unloading mechanism 234 and a wafer stage 236. Other sub-systems that are generally necessary for EBL or EBI include control electronics, vacuum systems, alignment systems, vibration isolation and magnetic shielding.

FIG. 2E shows an example of a uni-directional (1-D) layout process using both optical and electron beam lithography. "1-D" refers to 1-D gridded design rule. It is common to pattern the layout of 1-D designs by separating the 1-D design layout database into lines and cuts. A 1-D layout 242 is separated in the design layout database into a "line pattern" 244 and a "cut pattern" 246. The design layout database contains the information needed by lithography tools to pattern one or more layers on a substrate. A line pattern 244 generally comprises an array of unidirectional lines 248. Cut patterns 246 generally comprise line-cuts and holes 250.

Line patterns 244 are written by an optical lithography system, which can be followed by other process steps to increase the density of lines on the substrate 252. Cut patterns are written by e-beam lithography 254 (e.g., miniature e-beam column lithography). Such use of e-beam lithography (which can also write via holes and contact holes) is also called complementary e-beam lithography, or CEBL. The combination of such line-forming process followed by line-cuts written with CEBL to pattern a substrate layer is called complementary lithography. Optical masks can be made without any information about the cuts. CEBL uses only the cut database.

The optically-printed 252 line pattern 248 and the e-beam-written 254 cut pattern 250 combine to form a 1-D layer 256 on the substrate that corresponds to the 1-D pattern 242 specified by the design layout database. Separating the pattern 242 this way uses the respective unique capabilities of optical lithography and e-beam lithography. Optical lithography can efficiently print uniform parallel lines over a large area of a substrate. E-beam lithography inherently can write smaller features more effectively than an optical lithography tool.

FIG. 2F schematically shows an example of a 1-D layout pattern 260. Here, line patterns 244 (printed by an optical lithography system) are shown as horizontal lines 262, while cut patterns 246 (written by a CEBL system) are shown as (generally, much shorter) vertical lines 264. Example spacing and line/cut widths are shown; other spacing and widths can be used (e.g., in more advanced processes).

FIG. 2G shows an example of a complementary lithography process 270. One or more multiple, miniature-column, e-beam lithography systems 230 are used in combination with an optical lithography system 272 and other wafer processing tools (e.g. resist development and etch tools) to pattern a wafer layer. Here, optical lithography tools 272 expose 274 1-D lines 248. (Several other processing steps not shown in this figure follow, e.g., involving resist and hard masks. Every other mention of "mask" herein refers specifically to optical masks, i.e., masks used by an optical lithography system to expose a pattern.) E-beam lithography systems are then used to write 254 patterns 250 such as line cuts and holes. An etch tool 276 is used to etch 278 the resist, exposing the features written 254 by the e-beam tool 230.

Generally, e-beam lithography systems can write with higher resolution than optical lithography systems. However, in e-beam lithography, features are written serially (by individual beams), one at a time, as opposed to lithographic printing of a much larger area with optical tools using masks.

SUMMARY

The present application discloses systems, devices and methods for writing and inspecting a substrate using charged particle beam tools sharing the same or substantially the same substrate stage and beam column designs and the same design layout database, enabling automatic modification of the design layout database to increase yield rate.

In particular, the inventors have discovered that using write and inspection tools that share substantially the same stage and the same or substantially the same designs for respective arrays of multiple charged particle beam columns, and that access the same design layout database to target and write or inspect features, results in superior correlation of defectivity between inspection images and the design layout database. The beam deflection and stage controls used to write features to the substrate can be interpreted directly, per feature, to the beam deflection and stage controls used to inspect the written substrate, meaning that inspection images can be compared directly to the intended pattern.

As a result, the inventors have discovered it is possible to analyze inspection images, and perform automated detection AND correction of both random AND systematic feature defects, in that SAME design layout database accessed for both writing and inspection. Classification of detected defects based on expected effects on yield can also be automated. Consequently, MASKLESS design layout database optimization can be automated for rapid yield ramp, with iterative cycle time of write, inspect, analyze, and modify layout measured in hours or less.

BRIEF DESCRIPTION OF THE DRAWINGS

The disclosed inventions will be described with reference to the accompanying drawings, which show important sample embodiments and which are incorporated in the specification hereof by reference, wherein:

FIG. 2C schematically shows an example of a miniature e-beam column.

DETAILED DESCRIPTION OF SAMPLE EMBODIMENTS

Figure 1:
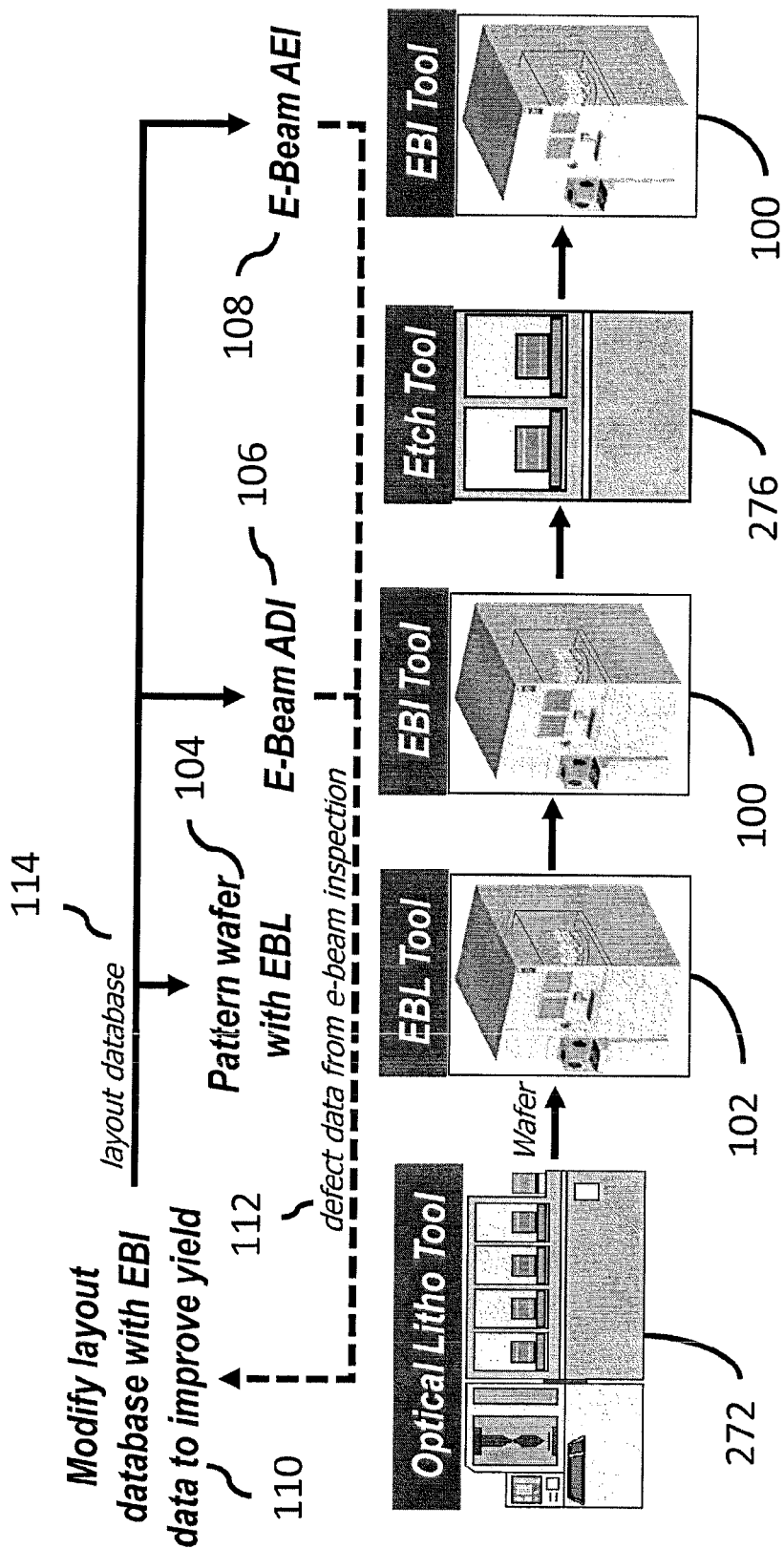
FIG. 1 shows an example process for lithography and inspection.
Figure 2A:
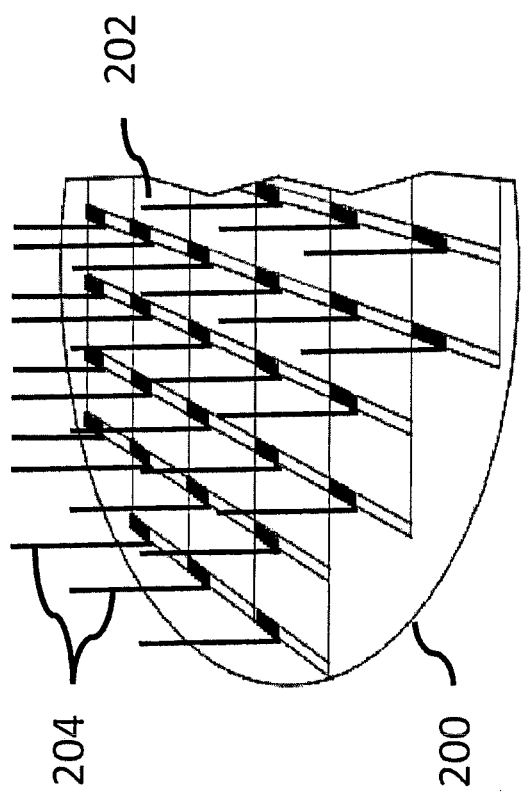
FIG. 2A shows an example of a wafer being scanned by multiple electron beams emitted by respective beam columns.
Figure 2B:
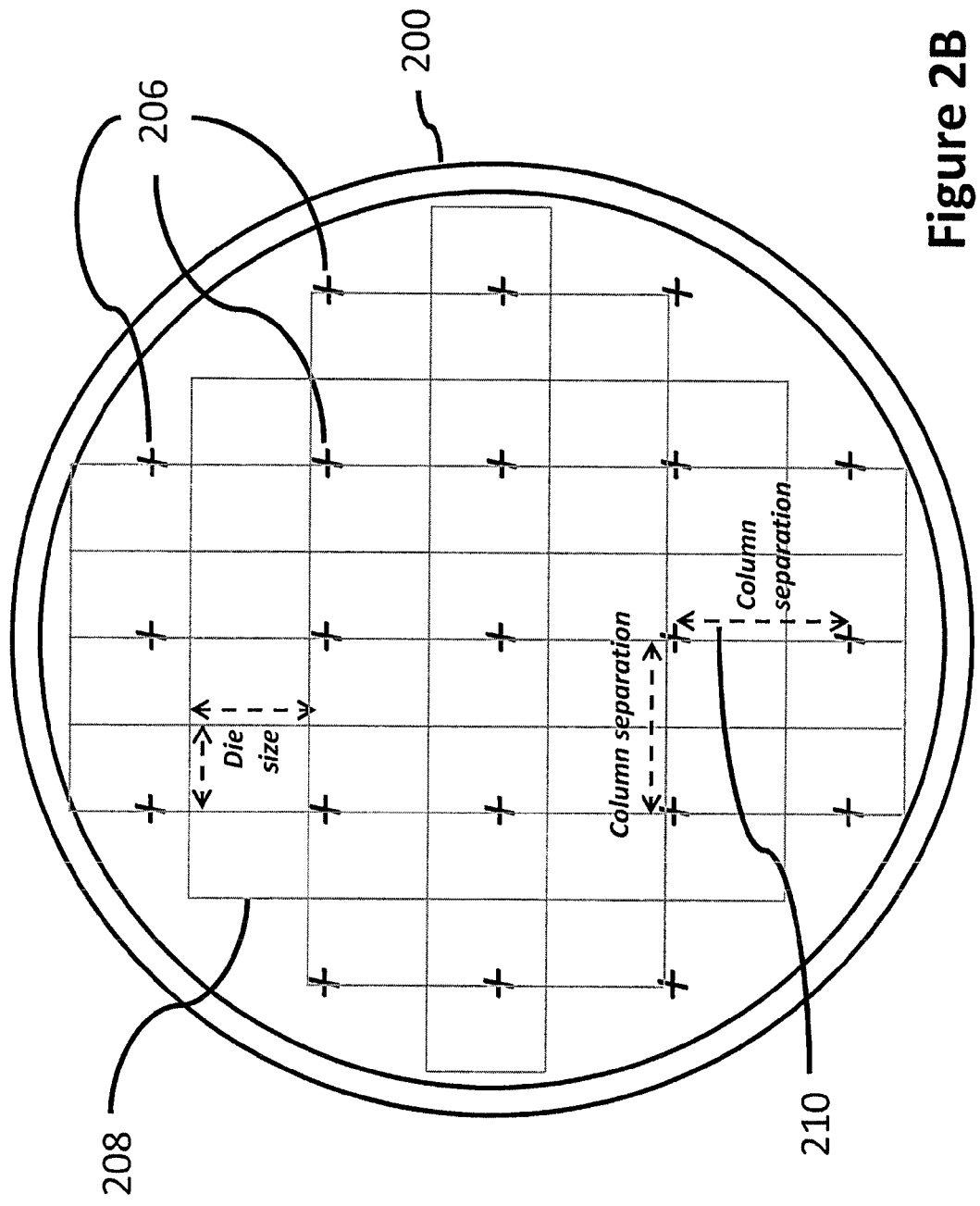
FIG. 2B shows an example of a wafer.
Figure 2D:
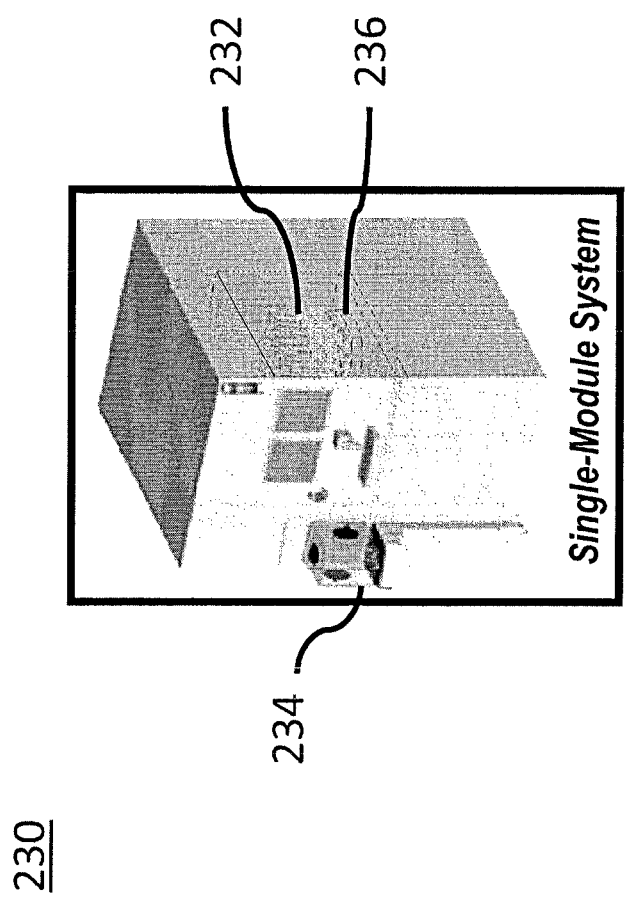
FIG. 2D schematically shows an example of a multi-column e-beam lithography or e-beam inspection system.
Figure 2E:
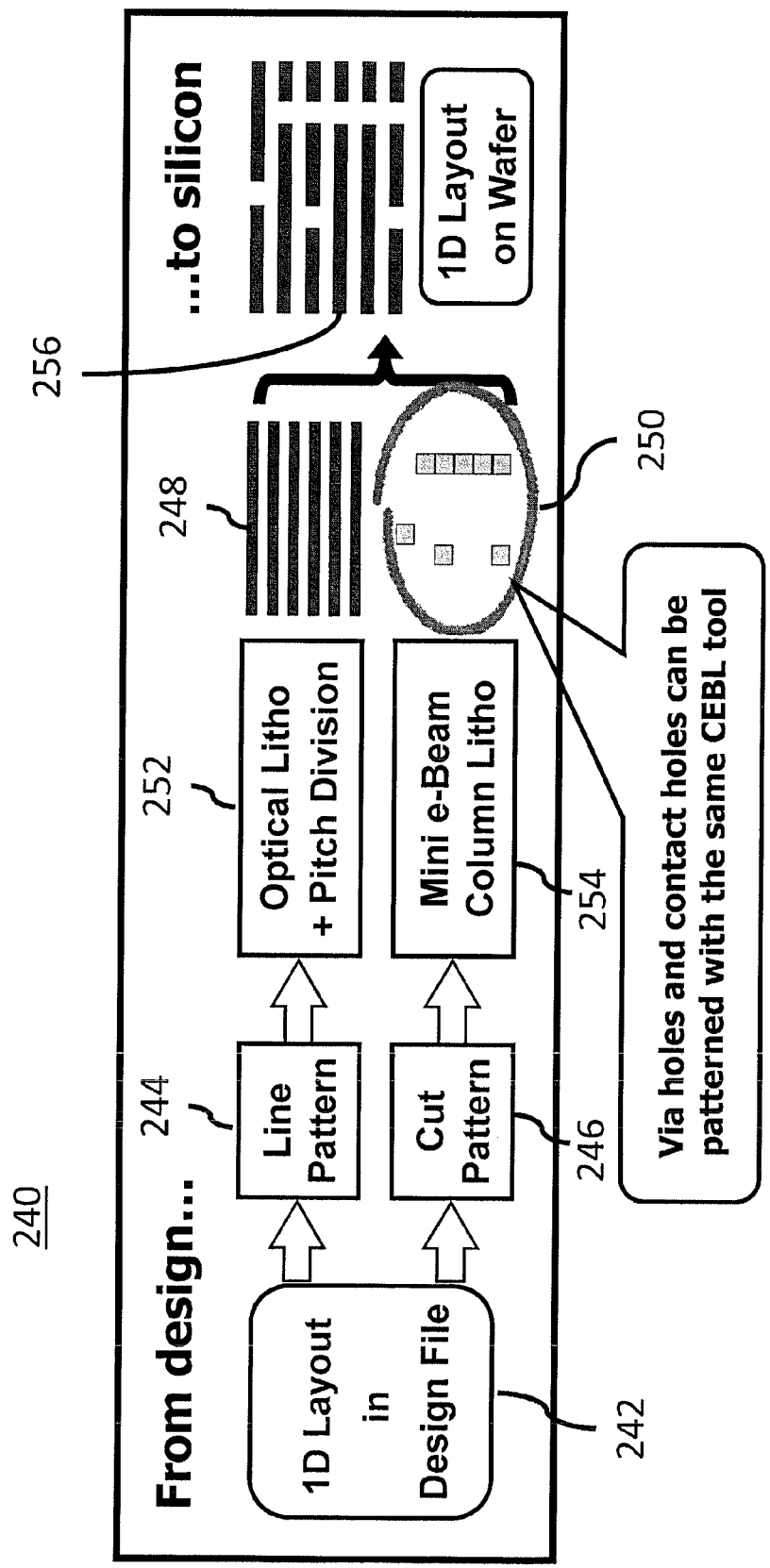
FIG. 2E shows an example of a 1-D layout process.
Figure 2F:
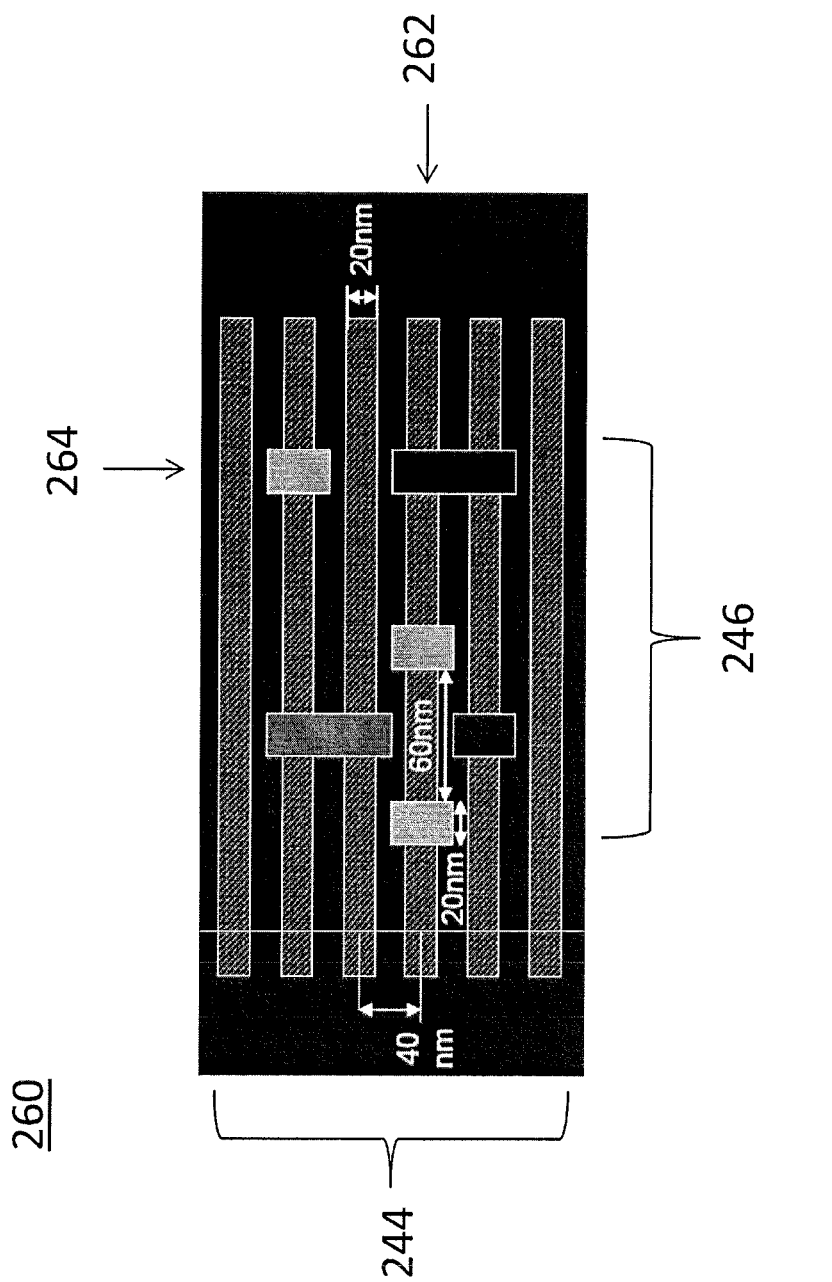
FIG. 2F schematically shows an example of a 1-D layout pattern.
Figure 2G:
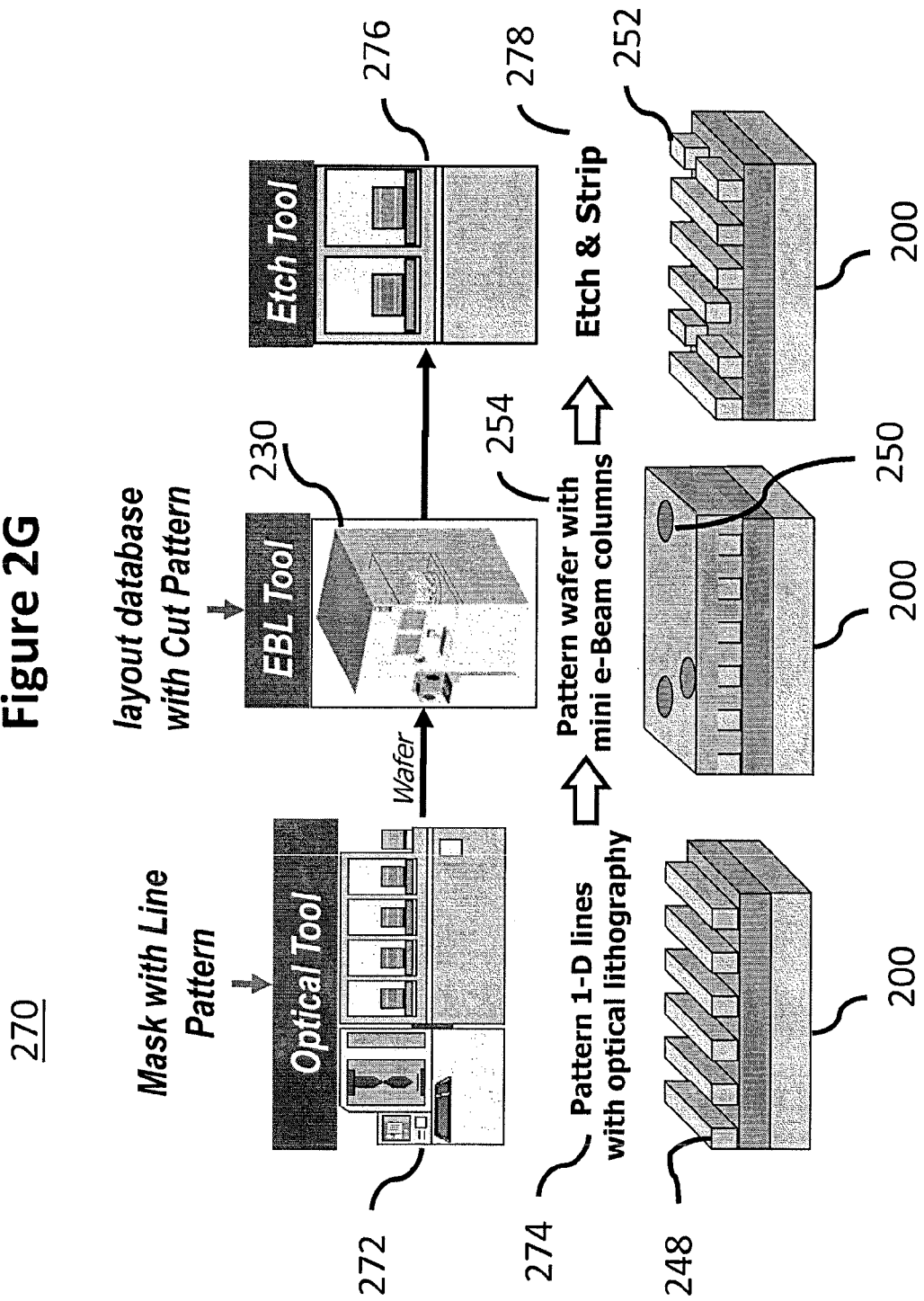
FIG. 2G shows an example of a complementary lithography process.

The numerous innovative teachings of the present application will be described with particular reference to presently preferred embodiments (by way of example, and not of limitation). The present application describes several inventions, and none of the statements below should be taken as limiting the claims generally.

The present application discloses systems, devices and methods for writing and inspecting a substrate using charged particle beam tools sharing the same or substantially the same substrate stage and beam column designs and the same design layout database, enabling automatic modification of the design layout database to increase yield rate.

In particular, the inventors have discovered that using write (lithography) and inspection tools that share substantially the same stage and the same or substantially the same designs for respective arrays of multiple charged particle beam columns, and that access the same design layout database to target and write or inspect features, results in superior correlation of defectivity between inspection images and the design layout database. The beam deflection and stage controls (and resulting targeted positions on the substrate) used to write features to the substrate can be interpreted directly, per feature, to the beam deflection and stage controls (and resulting targeted positions on the substrate) used to inspect the written substrate, meaning that inspection images can be compared directly to the intended pattern.

As a result, the inventors have discovered it is possible to analyze inspection images, and perform automated detection AND correction of both random AND systematic feature defects, in that SAME design layout database accessed for both writing and inspection. Classification of detected defects based on expected effects on yield can also be automated. Consequently, MASKLESS design layout database optimization can be automated for rapid yield ramp, with iterative cycle time of write, inspect, analyze, and modify layout measured in hours or less.

The disclosed innovations, in various embodiments, provide one or more of at least the following advantages. However, not all of these advantages result from every one of the innovations disclosed, and this list of advantages does not limit the various claimed inventions.

MASKLESS yield ramp for a 1-D lines-and-cuts database;

lithography-inspection-analysis-cutting database modification cycles for line cut yield ramp measured in hours or less;

improved yield;

automatic cutting database modification for process-related defect reduction or elimination and rapid yield ramp;

lower cost yield ramp;

faster yield ramp;

improved critical dimension uniformity and line edge roughness;

automatic defect detection/identification;

automatic defect classification;

complementary lithography usable in in-line production; and complementary lithography with throughput matching.

Some exemplary parameters will be given to illustrate the relations between these and other parameters. However it will be understood by a person of ordinary skill in the art that these values are merely illustrative, and will be modified by scaling of further (and/or future) device generations, and will be further modified to adapt to different materials or architectures if used.

As used herein, sets of multiple beam columns being "substantially the same" means that the sets of multiple beam columns comprise arrays of multiple miniature, electrostatically-driven columns with identical column-to-column spacing, and identical type (electrostatic) of beam deflection and focus mechanisms.

For stages, "substantially the same" means identical or nearly identical with respect to substrate-stage alignment mechanisms, stage positioning mechanisms, stage position accuracy, and control electronics and software. ("Nearly" identical means that the variations can include, for example, year-to-year improvements in design or manufacturing techniques, or incremental improvements or optimizations to a design, which can result in two stages being "substantially the same" but not identical. However, major changes in design approach will break substantial sameness.)

All inventive embodiments disclosed herein (e.g., with respect to FIGS. 1 and 3-12) use lithography tools and inspection tools that perform lithography and inspection, respectively, using miniature charged particle beam (preferably e-beam) column arrays that are substantially the same and substrate stages that are substantially the same, as well as the same design layout database (regardless of whether this is mentioned in respective discussion herein). All inventive embodiments disclosed herein are in the context of complementary charged particle beam (preferably e-beam) lithography (i.e., complementing a line-forming process using optical lithography). Inventive embodiments, satisfying these conditions, can be used to improve yield, critical dimension uniformity, and/or line edge roughness to accelerate factory, process, or product yield ramps.

"In-line production", as used herein, means production of patterned substrates in a factory production setting.

FIG. 1 shows an example process for lithography and inspection using substantially the same stages and column arrays and the same design layout database. As shown, a system-of-systems approach is used to improve process-limited (e.g., pattern-limited) yield by using feedback from multiple-miniature-column e-beam inspection systems 100 to modify the design layout database (e.g. the "cutting" database in CEBL) used by a multi-column e-beam lithography tool 102 to pattern wafers 200 (or other substrates). An optical lithography tool 272 patterns 274 a substrate with 1-D lines 248. Then, an EBL tool 102 using an array of miniature, electrostatically-driven columns patterns the substrate 104 (1-D line-cutting), which is mounted on a stage. After the substrate is developed, it is imaged 106 by an EBI tool 100 using substantially the same stage and substantially the same e-beam column array as the EBL tool 102. It can also be useful to use an EBI tool 100 to inspect the substrate again 108 (or instead), also using substantially the same stage and e-beam column array and the same design layout database as the EBL tool 102, after the substrate is etched 278 by an etch tool 276. EBL 102 and EBI 100 tools refer to the same design layout database in order to target and write 104 or image 106 and/or 108 (inspect) features.

By using e-beam lithography 102 and inspection 100 tools using miniature e-beam column arrays that are substantially the same and substrate stages that are substantially the same, as well as the same design layout database, the movements of the stage and the targeted locations of the respective e-beams in the lithography 102 and inspect 100 tools can be directly correlated. This enables feature images produced by e-beam inspection 106 and/or 108 to be directly and automatically compared (automatically means without any manual human intervention required) to corresponding features as represented in the same design layout database used for lithography 104 and inspection 106 and/or 108 in order to identify both random and systematic defects. (Generally, random defects are randomly distributed faults such as those due to particle contamination, and systematic defects are predictable defects such as those due to pattern-dependent lithographic variation.) It further enables defects to be automatically classified by type, depending on, for example: likelihood to cause yield loss caused by deviations in parametric performance or failure of device function; and whether the respective defect is likely to have been caused by a process failure (e.g., related to the features specified by the design layout database, etch parameters, e-beam parameters, or other process characteristics), rather than an environmental (e.g., particulate) or other type of failure.

Defects caused by a pattern-related process failure are then analyzed to automatically modify the design layout database 110 to lower the likelihood of further substrates written 104 with the design layout database showing the same or similar defects on inspection 106 and/or 108. (This lowered likelihood of producing defects is referred to herein as reducing defects.) The modified design layout database can also be used by an EBL tool 102 to repair the detected defects in the already-written substrate. Automatic design layout database modification 110 can, for example, change the location of one or more line cuts; other layout modifications are also possible (and, typically, likely). While individual modification iterations will typically not guarantee elimination of individual defects, repeated write-image-analyze-modify cycles will tend to converge a design layout database to a higher-yield design layout.

Automatic identification of defects can be performed at least in part by column controllers local to respective e-beam columns and storing portions of the design layout database corresponding to the substrate portion(s) targeted by respective e-beam columns. E-beam inspection data can be "fed back" 112 to design and layout software to perform automatic modification of the design layout database 110 to improve pattern-limited (or other process-limited) yield. The modified design layout database (e.g., with one or more modified "cut" layouts) can then be "fed forward" 114 to an e-beam lithography tool(s) 102 to repeat the process (iterate the yield ramp cycle) to further improve yield and reduce (or eliminate) defects (particularly yield-reducing defects). Preferably, this cycle is continued until a desired yield rate is achieved for the design layout database (i.e., cutting database).

The optical portion of a layout comprises uni-directional (1-D) lines 244, which can be exposed 274 by an optical lithography tool 272 (e.g., at an optical resolution limit). These 1-D lines 248 typically have fewer defects than non-1-D optical patterning.

The CEBL portion of the design is comprised of line cuts. The line cuts are critical, and difficult to pattern optically. Optimization of the CEBL line cut database (CEBL portion of the design layout database) accelerates yield ramp. Since this CEBL yield ramp process is MASKLESS, it can be very fast: cycle times measured in hours instead of weeks for lithography 104, inspection 106 and/or 108, automatic image analysis, and automatic modification of design layout database 110 to mitigate (or eliminate) yield-reducing defects.

CEBL can also be used for cutting holes (i.e. contact and via holes).

In an optical lithography process, design modification generally requires production of a new set of masks, which typically takes several weeks and millions of dollars at advanced process nodes. Therefore, minimizing the portion of yield ramp required by optical lithography can make overall yield ramp much faster and much less expensive.

This yield ramp cycle can also be performed using defect data from focus-exposure or other stress tests. Defect data from such stress tests can be automatically analyzed to determine which e-beam parameter values (where e-beam parameters include beam energy (landing voltage), beam focus, exposure time and beam current) are least likely to cause yield-reducing defects; and the e-beam parameters with the best yield window can then be fed forward to an e-beam lithography tool(s) for lithography and/or further stress tests. Stress test defect data can also be analyzed to allow automatic modification of the design layout database 110 to improve process robustness.

Figure 3:
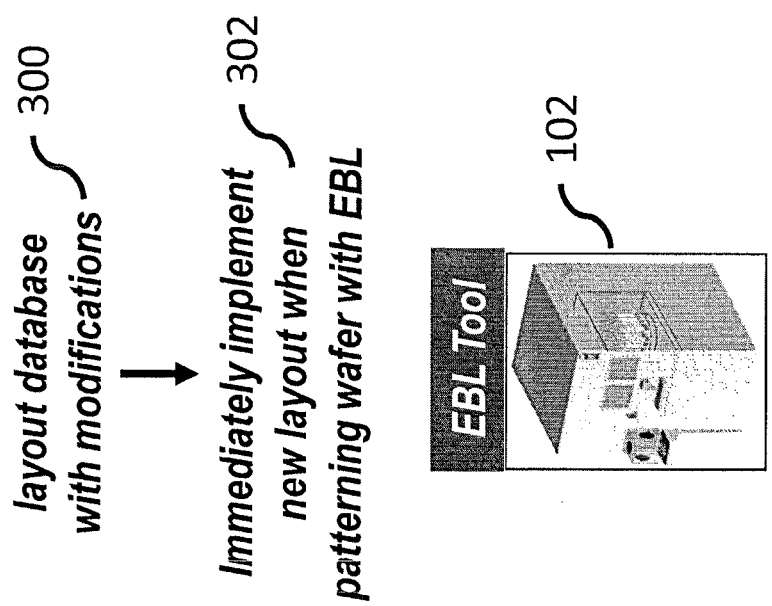
FIG. 3 shows an example of an e-beam lithography process.

FIG. 3 shows an example of an e-beam lithography process. As shown, a design layout database 300 (e.g. a "cutting" database) automatically modified 110 to improve yield can be IMMEDIATELY implemented in substrate patterning 302 using multiple-miniature-column e-beam lithography 104 to improve yield, critical dimension (CD) uniformity and/or line edge roughness (LER). The ability to rapidly and MASKLESSLY perform yield ramp cycles on the line cut portion of the pattern, as described with respect to FIG. 1—write 104, inspect after develop 106 and/or etch 108, automatically analyze inspection images for defects and classify defects into types, automatically modify the design layout database 110 to reduce incidence of detected defects, and repeat to ramp yield—thus becomes very attractive to reduce yield ramp costs and greatly accelerate overall yield ramp to production entitlement yield levels, among other advantages.

Figure 4:
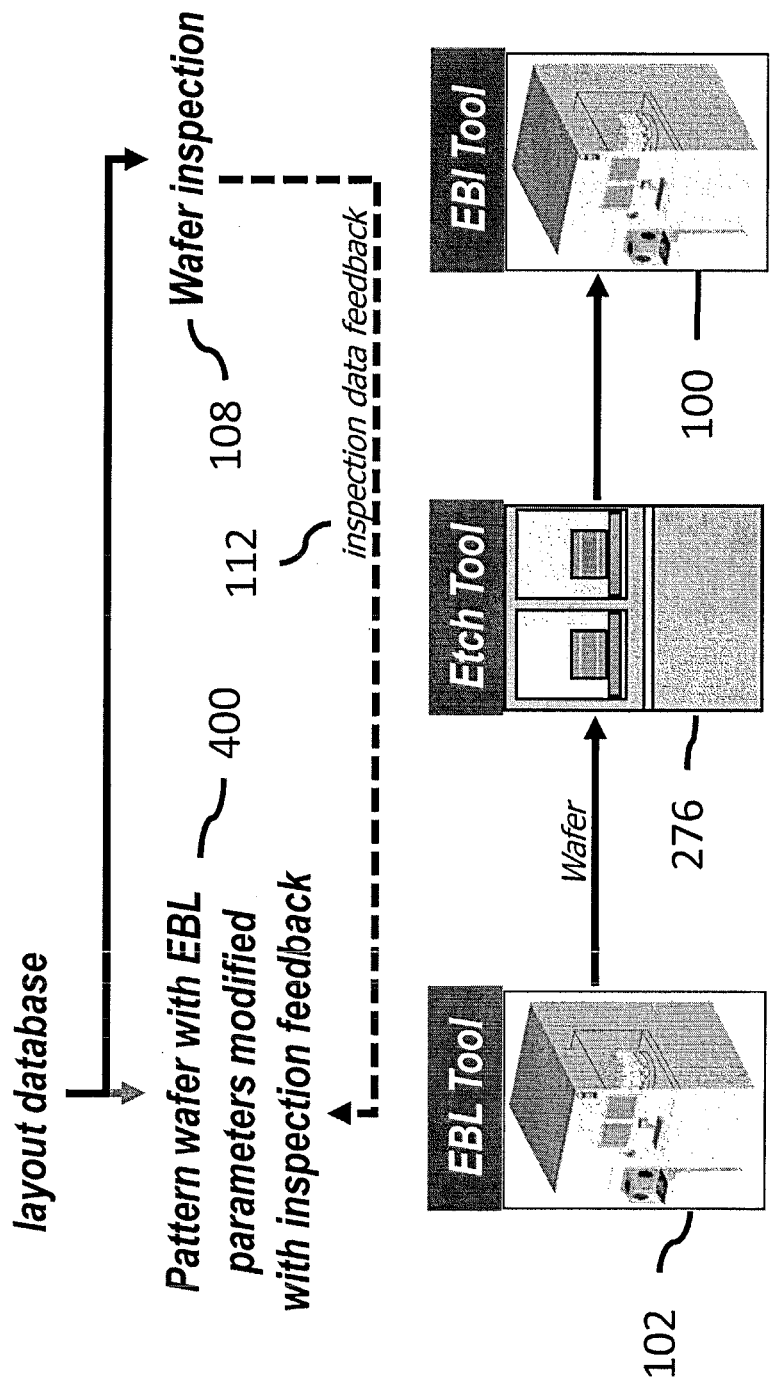
FIG. 4 shows an example process for lithography, etch and inspection.

FIG. 4 shows an example process for lithography, etch and inspection, using substantially the same stages and column arrays and the same design layout database for lithography and inspection. As shown, a system-of-systems approach is used to improve yield following an etch process 278 by using feedback 112 from a multiple-miniature-column e-beam inspection system 100 to modify parameters 400 (e.g., e-beam parameters) of a multiple-miniature-column e-beam lithography system 102 (CEBL). Variations in EBL parameters used to control the e-beam columns can be evaluated based on resulting defects, and automatically analyzed and modified 400 to reduce or eliminate defects in later iterations of lithography and inspection using the modified EBL parameters. This process can be iterated to optimize EBL parameters, minimize contributions from the EBL tool 102 (rather than from the pattern written by the EBL tool) to process-driven yield loss, and to ramp yield.

Figure 5:
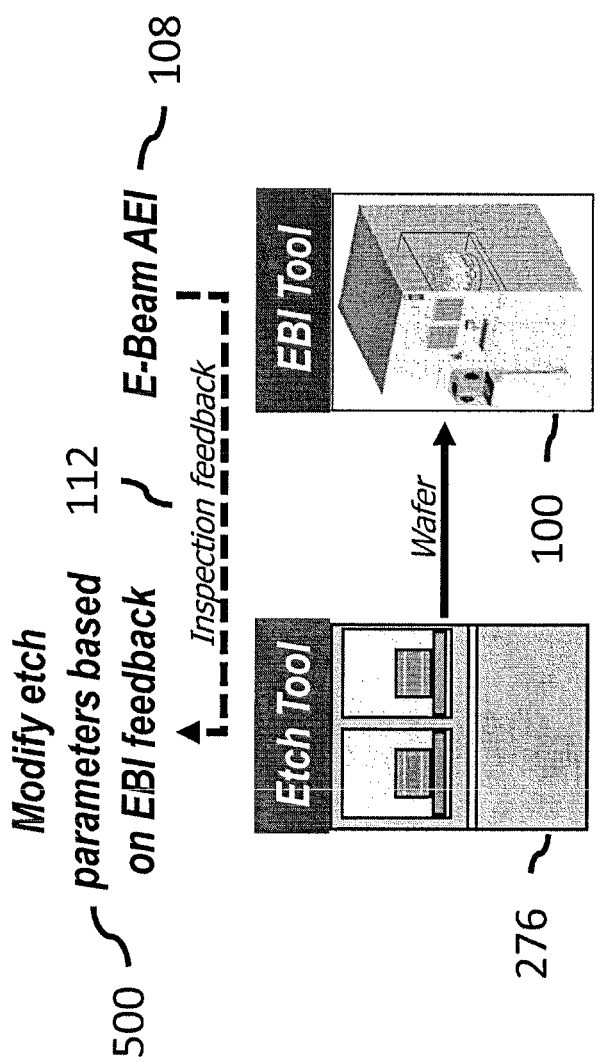
FIG. 5 shows an example process for etch and inspection.

FIG. 5 shows an example process for etch and inspection. As shown, a system-of-systems approach is used to improve yield of the etch process 278 by using feedback 112 from a multiple-miniature-column e-beam inspection system 100 to modify parameters 500 of an etch tool. Variations in etch parameters can be evaluated based on resulting defects, and automatically analyzed and modified 500 to reduce or eliminate defects in later iterations of etch and inspection using the modified parameters. This process can be iterated to optimize etch parameters, minimize etch contributions to process-driven yield loss, and to ramp yield.

Etch parameters can include, for example, temperature, pressure, total duration, gas flow rates, gas mixture, duration of different etch phases, and electromagnetic field strength.

Figure 6:
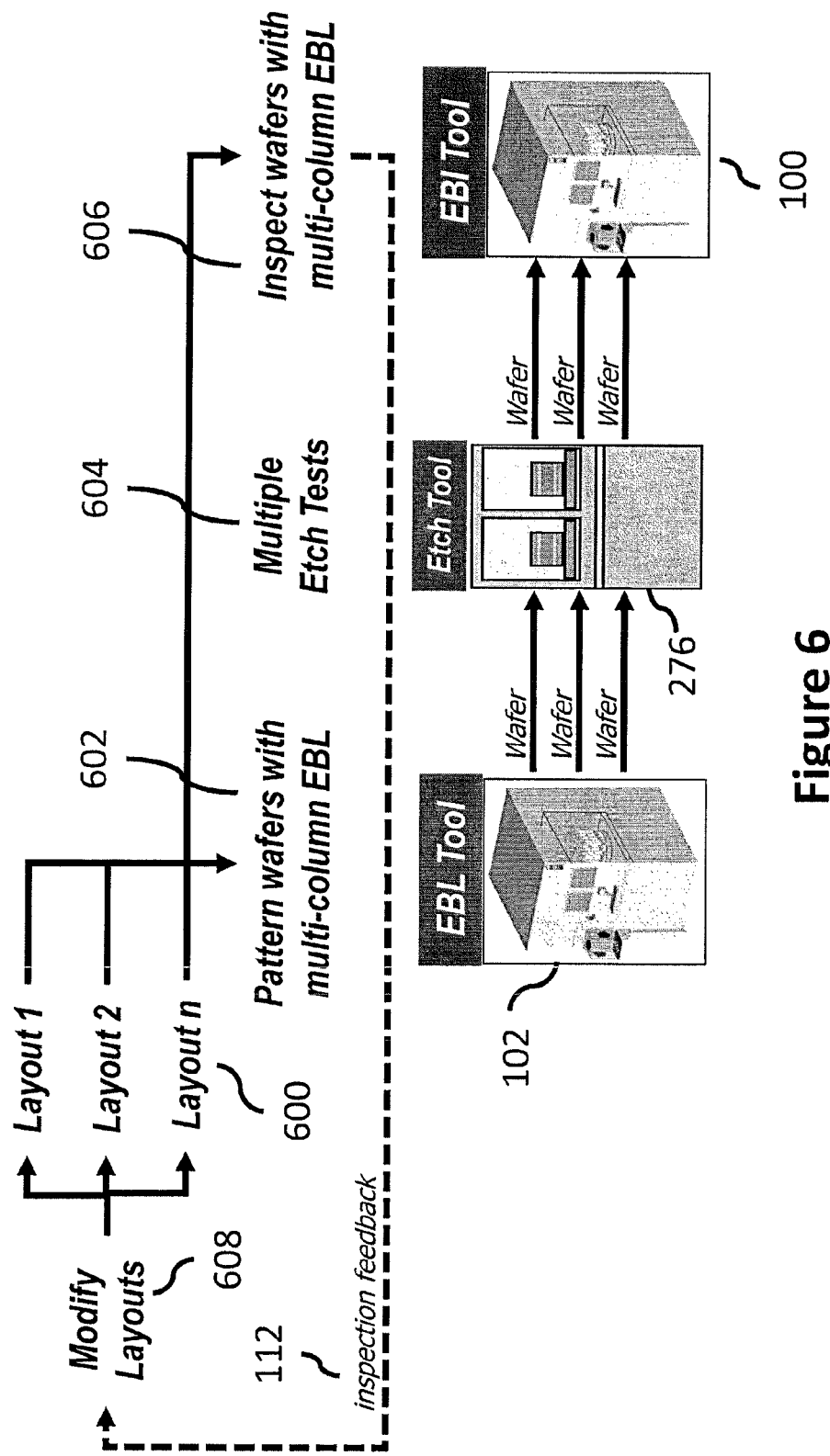
FIG. 6 shows an example process for lithography, etch and inspection.

FIG. 6 shows an example process for lithography, etch and inspection, using substantially the same stages and column arrays and the same design layout database for lithography and inspection. As shown, multiple design layout databases 600 are patterned 602 onto multiple wafers 200 using multiple-miniature-column e-beam lithography 104 (CEBL). Various e-beam exposure parameters can be used on the same wafer 200. The wafers 200 are then etched 604. Various etch parameters (e.g., power, pressure, gas mixture and flow rates) are used to etch the wafers 200. The wafers 200 are then inspected using multiple-miniature-column e-beam inspection 606. Inspection data is fed back to design and layout software 112 to automatically modify and improve the design layout databases 608 and/or to improve e-beam lithography parameters and/or etch parameters based on which layout has the largest etch yield window. Iterating this procedure results in rapid yield ramp (and roughly correlates to a combination of yield ramp procedures disclosed with respect to FIGS. 1, 4 and 5).

Figure 7:
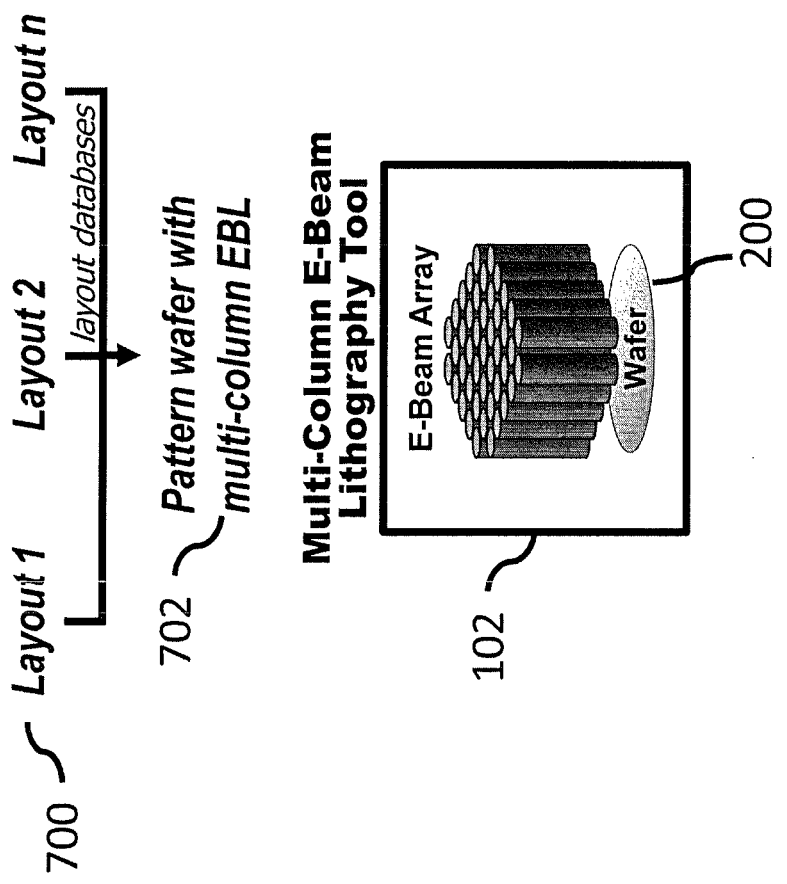
FIG. 7 shows an example process for lithography.

FIG. 7 shows an example process for lithography. As shown, portions of multiple design layout databases 700 are patterned 702 onto the same wafer 200 using multiple-miniature-column e-beam lithography 104, with some or all different columns writing features specified by design layout database portions respectively corresponding to different design layout databases. EBL parameters (e-beam exposure parameters) can also be varied on the same wafer 200, with different EBL parameters used by different columns. Etch parameters can also be varied per-wafer 200. This approach can be used to facilitate a design of experiments (DOE), e.g., a patterning stress test, to improve pattern-limited (or otherwise process-limited) yield.

Figure 8:
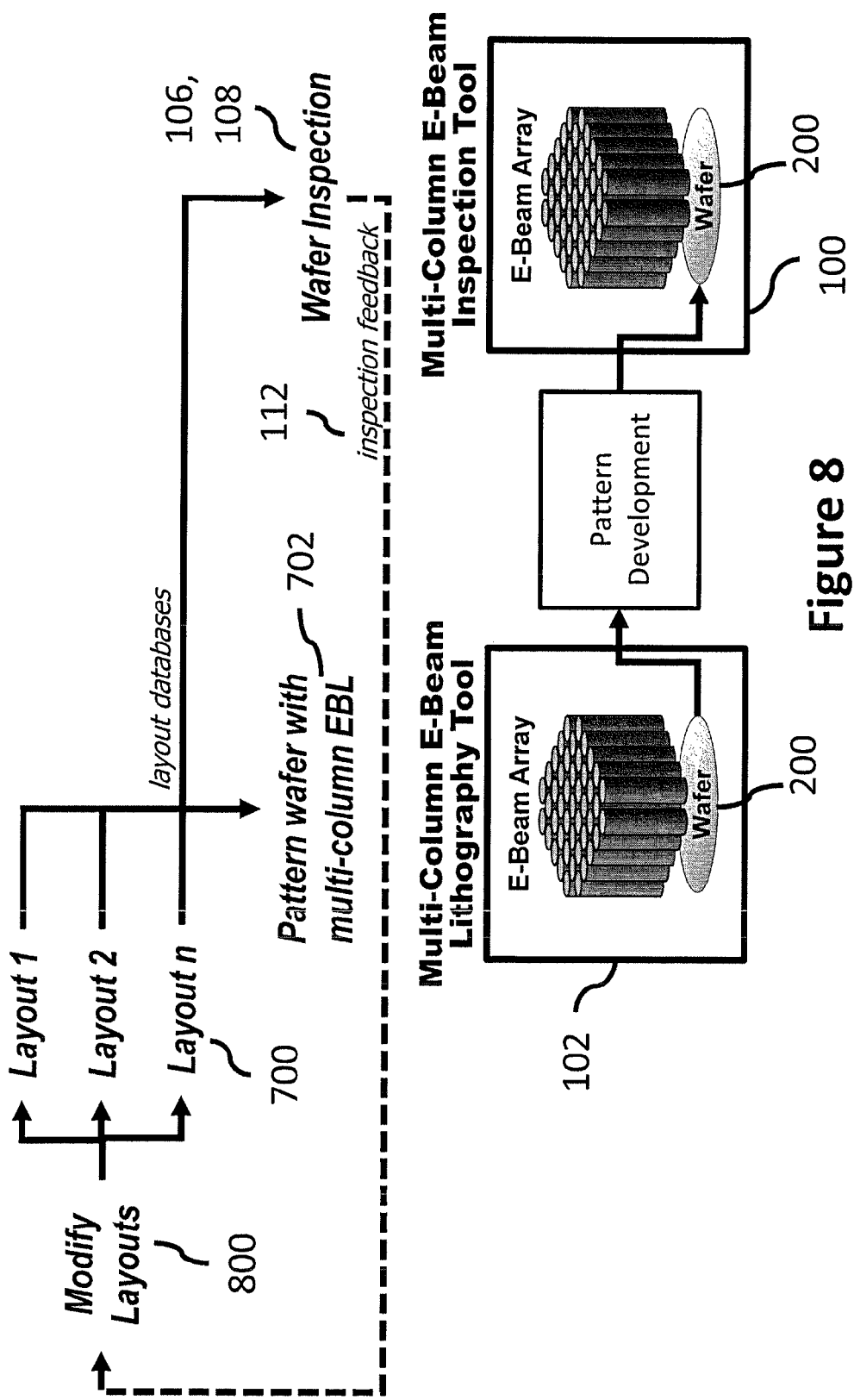
FIG. 8 shows an example process for lithography and inspection.

FIG. 8 shows an example process for lithography and inspection using substantially the same stages and column arrays and the same design layout database. As shown, portions of multiple design layout databases are patterned onto the same wafer 200 using multiple-miniature-column e-beam lithography 104. The wafer 200 is then inspected using multiple-miniature-column e-beam inspection 106 and/or 108. Inspection data is then fed back to design and layout software 112 to modify the design layout databases 800 to reduce (or eliminate) defects and improve yield. By iterating this process, this approach can be used to rapidly converge to an optimal layout or set of layouts that can be used for in-line production with high yield.

Additional DOE principles, as disclosed with respect to, e.g., FIG. 7 (e.g., modifying EBL parameters and etch parameters), can also be used in embodiments as shown in FIG. 8.

Figure 9:
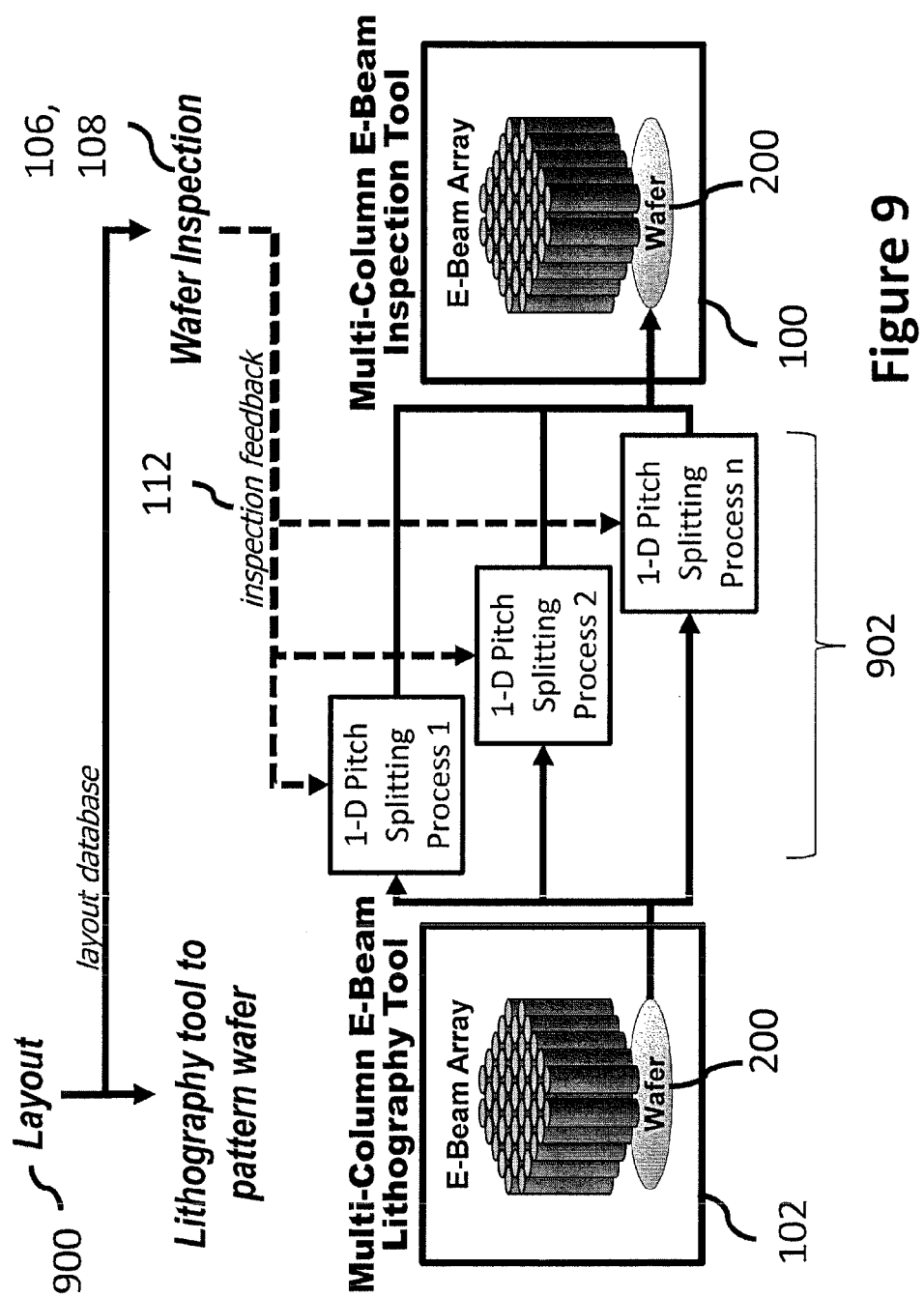
FIG. 9 shows an example process for lithography and inspection.

FIG. 9 shows an example process for lithography and inspection using substantially the same stages and column arrays and the same design layout database. As shown, a layout 900 is patterned onto several wafers 200 using multiple-miniature-column e-beam lithography 104. Different wafers 200 are then processed with different 1-D pitch splitting processes to multiply the line density 902 (i.e., a DOE approach). The wafer 200 is then inspected with multiple-miniature-column e-beam inspection 106 and/or 108. Inspection data is then fed back 112 to automatically modify the pitch splitting processes to reduce (or eliminate) yield-reducing defects. This approach can be used to rapidly converge to an optimal pitch splitting process.

Figure 10:
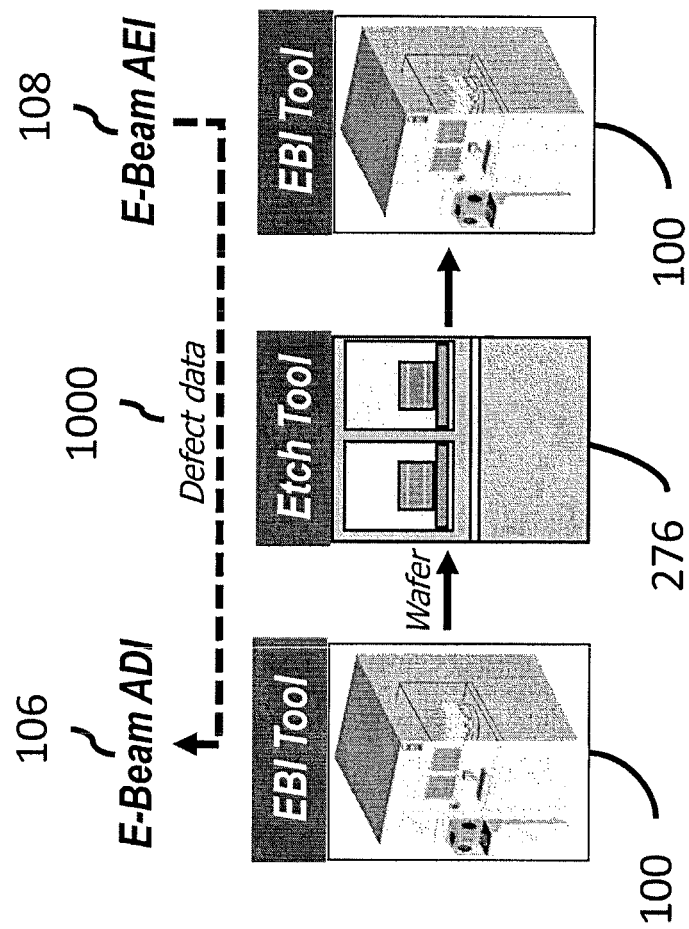
FIG. 10 shows an example of a process for inspection.

FIG. 10 shows an example of a process for inspection. As shown, a system-of-systems approach is used to improve combined performance of multiple-miniature-column e-beam after-develop inspection (ADI) 106 and multiple-miniature-column e-beam after-etch inspection (AEI) 108. Defect data from said AEI 108 can be fed back 1000 to said ADI 106 to identify "care-areas" for EBI—e.g., areas to be inspected with higher resolution than usual in order to more reliably image potentially defective or otherwise critical features, in this case as identified by analysis of AEI 108 inspection data. This can result in "early identification" of defect types that are likely to cause yield loss, enabling rework (repair of defects identified using ADI 106 inspection data) prior to etching.

Figure 11:
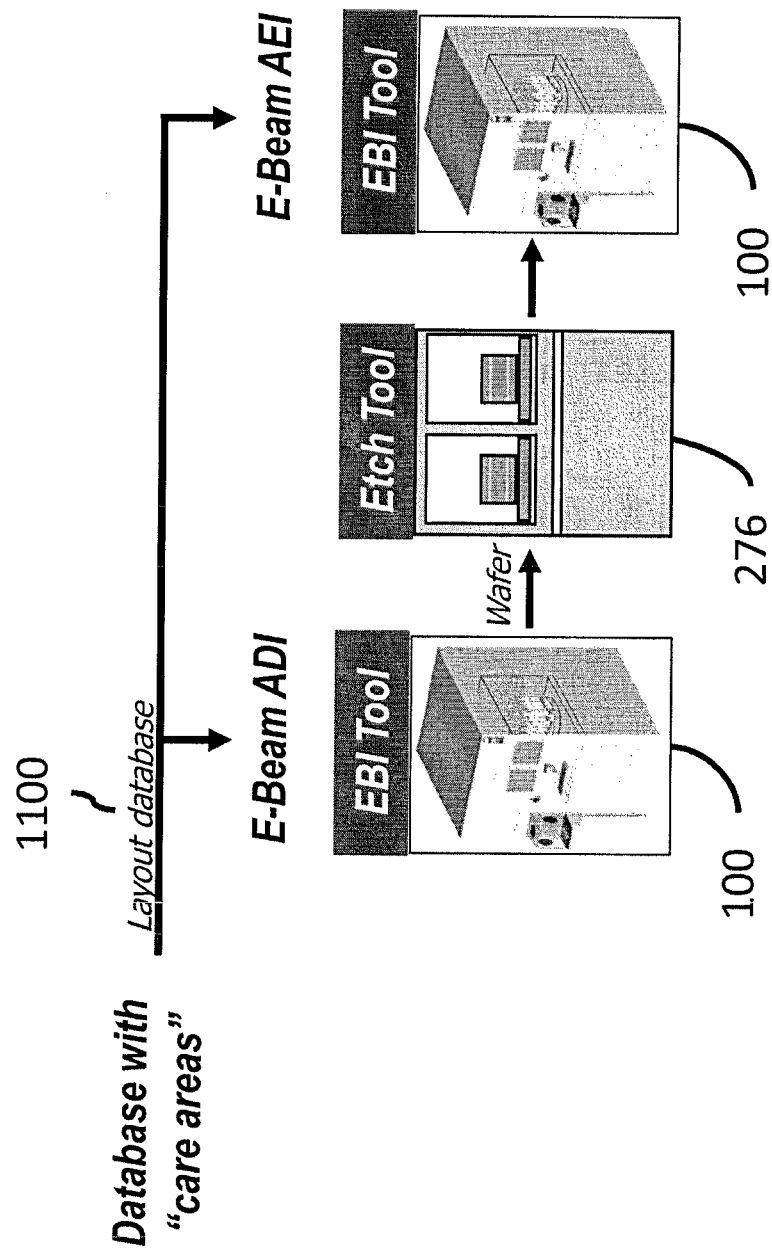
FIG. 11 shows an example of a process for inspection.

FIG. 11 shows an example of a process for inspection. As shown, a system-of-systems approach is used to improve overall performance of complementary multiple-miniature-column e-beam lithography 104 (EBL) and multiple-miniature-column e-beam inspection 106 and/or 108 (EBI). Position data from EBL can be fed forward to an After Develop Inspection (ADI) tool 106 or an After Etch Inspection (AEI) tool 108 to designate care-areas for EBI. Here, care areas can be determined based on, e.g., the design layout database 1100.

Figure 12:
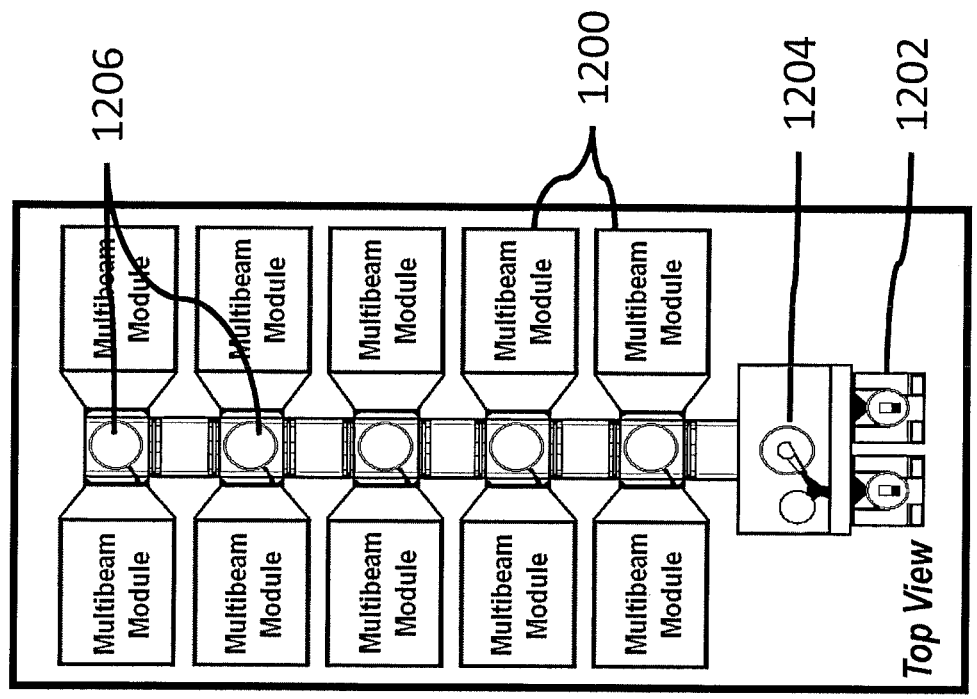
FIG. 12 shows an example of a modular EBL and/or EBI system.

FIG. 12 schematically shows an example of an EBL and/or EBI system comprising multiple multiple-miniature-column e-beam lithography and/or multiple-miniature-column e-beam inspection modules 1200, as well as sub-systems for wafer loading/unloading 1202, wafer handling 1204, and wafer transport 1206. Other EBL and/or EBI sub-systems, e.g., control electronics, vacuum systems, alignment systems, vibration isolation and magnetic shielding, can also be included (these sub-systems are generally necessary for EBL and EBI). By modularizing EBL and EBI tools, individual tools comprising multiple modules in a single integrated tool can be used to match the throughput of other tools (e.g., optical lithography tools) in a production line (in-line production). EBL and EBI modules 1200 and/or EBL 102 and EBI 100 tools used together in a write-inspect-analyze-modify cycle use substantially the same stages and column arrays and the same design layout database.

According to some but not necessarily all embodiments, there is provided: A method of writing resist-coated substrates using multiple charged particle beams, comprising the actions of: writing multiple cut features specified by a design layout database onto at least one substrate; imaging said features, said features being targeted in at least partial dependence on the design layout database; automatically identifying one or more defects in ones of said features in at least partial dependence on said imaging and the design layout database; automatically modifying the design layout database, in at least partial dependence on said identifying; and repeating at least said writing using said modified design layout database; wherein said writing and said imaging use multiple charged particle beams produced by multiple columns that are substantially the same, different ones of said beams targeting different portions of the substrate; and wherein the stages on which the substrate is mounted during said writing and said imaging are substantially the same.

According to some but not necessarily all embodiments, there is provided: A method of writing resist-coated substrates using charged particle beams, comprising the actions of: writing multiple cut features specified by a design layout database onto at least one substrate; etching said substrate using etch parameters; imaging said features, said features being targeted in at least partial dependence on the design layout database; automatically identifying one or more defects in ones of said features in at least partial dependence on said imaging and the design layout database; automatically modifying at least one of said etch parameters, in at least partial dependence on said identifying; and repeating at least said writing and said etching using said modified etch parameters; wherein said writing and said imaging use multiple charged particle beams produced by multiple columns that are substantially the same, different ones of said beams targeting different portions of the substrate; and wherein the stages on which the substrate is mounted during said writing and said imaging are substantially the same.

According to some but not necessarily all embodiments, there is provided: A method of writing resist-coated substrates using charged particle beams, comprising the actions of: writing multiple cut features specified by at least one design layout database onto at least one substrate; imaging said features, said features being targeted in at least partial dependence on the design layout database; automatically identifying one or more defects in ones of said features in at least partial dependence on said imaging and the design layout database; automatically modifying the design layout database, in at least partial dependence on said identifying, to lower the rate of yield-reducing ones of said defects; and iteratively repeating said writing, said imaging, said identifying and said modifying using successively modified ones of the design layout database; wherein said writing and said imaging use multiple charged particle beams produced by multiple columns that are substantially the same, different ones of said beams targeting different portions of the substrate; and wherein the stages on which the substrate is mounted during said writing and said imaging are substantially the same.

According to some but not necessarily all embodiments, there is provided: A system for writing resist-coated substrates using charged particle beams, comprising: at least one lithography tool, and at least one inspection tool, said lithography tool and said inspection tool both comprising: a substrate stage; multiple charged particle beam columns, ones of said columns being configured to produce a charged particle beam, different ones of said beams targeting different corresponding portions of the substrate; and one or more beam controllers, configured to control said columns to write cut features to the substrate in said lithography tool, and configured to control said columns to image said features in said inspection tool, said features being specified by a design layout database; an inspection data analyzer, configured to receive said feature images from said columns, and to automatically identify one or more defects in ones of said features in at least partial dependence on said feature images and the design layout database; and a design layout database modifier, configured to automatically modify the design layout database in at least partial dependence on said identified defects; wherein said lithography tool and said inspection tool comprise substantially the same substrate stage and substantially the same columns, and the same design layout database is used by said lithography tool and said inspection tool.

According to some but not necessarily all embodiments, there is provided: A system for writing resist-coated substrates using charged particle beams, comprising: at least one lithography tool, and at least one inspection tool, said lithography tool and said inspection tool both comprising: a substrate stage; multiple charged particle beam columns, ones of said columns being configured to produce a charged particle beam, different ones of said beams targeting different corresponding portions of the substrate; and one or more beam controllers, configured to control said columns to write cut features to the substrate in said lithography tool, and configured to control said columns to image said features in said inspection tool, said features being specified by a design layout database; an etch tool configured to remove material, from the portions of the substrate written by said lithography tool, in at least partial dependence on etch parameters; an inspection data analyzer, configured to receive said feature images from said columns, and to automatically identify one or more defects in ones of said features in at least partial dependence on said feature images and the design layout database; and an etch parameter modifier, configured to automatically modify said etch parameters in at least partial dependence on said identified defects; wherein said lithography tool and said inspection tool comprise substantially the same substrate stage and substantially the same columns, and the same design layout database is used by said lithography tool and said inspection tool.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

Inventive embodiments are disclosed herein using electron beams and electron beam columns. Those skilled in the art of charged particle beam lithography will understand that the inventions disclosed herein can also be embodied using other types of charged particle beams and miniature charged particle beam columns.

Some embodiments are disclosed herein with respect to wafers. Those skilled in the art will understand that other types of substrates can also be used.

In some embodiments, the e-beam column array is arranged in a rectangular grid pattern. In some embodiments, the e-beam column array uses a different pattern (e.g., a close-packed array).

Some embodiments use the combination of CEBL and multiple miniature e-beam column inspection, with substantially the same substrate stage and column array and the same design layout database for write and inspect tools, for in-line production, e.g., to perform additional yield ramp and/or quality assurance.

Automatic design layout database modification has been disclosed hereinabove as changing the location of one or more line cuts. It will be apparent to those of ordinary skill in the art that other design layout database modifications are both feasible and advantageous to be performed automatically to correct feature defects and perform the other corrective actions disclosed herein.

In some embodiments, automatic modifying the design layout database as disclosed with respect to, e.g., FIG. 1, reduces, but does not eliminate, the yield-reducing effects of one or more identified defects (e.g., deviations in parametric performance are reduced, but not eliminated).

In some embodiments, automatically modifying the design layout database as disclosed with respect to, e.g., FIG. 1, reduces or eliminates at least some non-yield reducing defects.

In some embodiments, only portions of the column array used for e-beam inspection of a substrate are substantially the same as corresponding portions of the column array used for e-beam lithography of the substrate. In such embodiments, automatic identification of defects and automatic modification of the design layout database to improve yield can be performed at least with respect to the portions of the substrate targeted by the corresponding column array portions and the portions of the design layout database written by said corresponding column array portions.

In some embodiments, a line-forming process other than optical lithography is used.

In some embodiments, e-beam columns are used in combination with a hole-forming process.

In some embodiments, at least part of the automatic modification to improve yield is performed by column controllers local to respective columns and storing portions of the design layout database corresponding to the portion(s) of the substrate targeted by respective columns.

In some embodiments, users can contribute design layout database modifications.

In some embodiments, the contents of inspection data, fed back to analysis and/or automatic modification hardware and/or software, are tailored (e.g., by local control computers) to the database or parameters being modified (e.g., the design layout database, e-beam parameters, etch parameters, etc.).

In some embodiments, a lithography tool and an inspection tool are the same tool.

In some embodiments, a lithography tool and an inspection tool are separate tools.

Additional general background, which helps to show variations and implementations, may be found in the following publications, all of which are hereby incorporated by reference: Liu, David and Prescop, Ted, "EBDW Overcoming Challenges in Extending Optical 193 nm Lithography", 2010 International Symposium on Lithographic Extensions, c. 2010.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

Additional general background, which helps to show variations and implementations, as well as some features which can be implemented synergistically with the inventions claimed below, may be found in the following US patent applications. All of these applications have at least some common ownership, copendency, and inventorship with the present application, and all of them, as well as any material directly or indirectly incorporated within them, are hereby incorporated by reference: U.S. Pat. No. 6,355,994; U.S. Pat. No. 6,617,587; U.S. Pat. No. 6,734,428; U.S. Pat. No. 6,738,506; U.S. Pat. No. 6,777,675; U.S. Pat. No. 6,844,550; U.S. Pat. No. 6,872,958; U.S. Pat. No. 6,943,351; U.S. Pat. No. 6,977,375; U.S. Pat. No. 7,122,795; U.S. Pat. No. 7,227,142; U.S. Pat. No. 7,435,956; U.S. Pat. No. 7,456,402; U.S. Pat. No. 7,462,848; U.S. Pat. No. 7,786,454; U.S. Pat. No. 7,928,404; U.S. Pat. No. 7,941,237; U.S. Pat. No. 8,242,457; and U.S. Pat. No. 8,384,048; and U.S. patent application Ser. No. 14/085,768.

The claims as filed are intended to be as comprehensive as possible, and NO subject matter is intentionally relinquished, dedicated, or abandoned.

What is claimed is:

1. A method of writing resist-coated substrates using multiple charged particle beams, comprising the actions of:
    writing multiple cut features specified by a design layout database onto at least one substrate;
    imaging said features, said features being targeted in at least partial dependence on the design layout database;
    automatically identifying one or more defects in ones of said features in at least partial dependence on said imaging and the design layout database;
    automatically modifying the design layout database, in at least partial dependence on said identifying; and
    repeating at least said writing using said modified design layout database;
    wherein said writing and said imaging use multiple charged particle beams produced by multiple columns that are substantially the same, different ones of said beams targeting different portions of the substrate; and
    wherein the stages on which the substrate is mounted during said writing and said imaging are substantially the same.

2. The method of claim 1, wherein successive iterations of said repeating either use the substrate and said writing is used to repair said defects, or use successively different substrates.

3. The method of claim 1, wherein said writing writes said features onto the resist layer coated on the surface of the substrate, said resist being sensitive to charged particle beam exposure; further comprising developing said written resist to form layout features on said substrate; wherein said imaging images said layout features.

4. The method of claim 1, wherein stage movements and beam deflections used to target said features in said writing and said imaging are the same, except for separate per-column beam alignment offsets for said writing and said imaging, said offsets determined prior to said writing and said imaging, respectively.

5. The method of claim 1, wherein different ones of said columns are controlled by different ones of multiple controllers local to corresponding ones of said columns, and wherein said controllers store the portion of the design layout database targeted by said corresponding ones of said columns.

6. The method of claim 5, wherein said controllers perform at least some of said identifying.

7. The method of claim 1, wherein said charged particle beams are electron beams, said columns are miniature columns using electrostatic deflection to target the substrate, and said stages are configured to have substantially the same substrate-stage alignment mechanisms, stage positioning mechanisms, stage position accuracy, and control electronics and software.

8. The method of claim 1, wherein said repeating said writing is performed immediately after said modifying, wherein no new mask is made before said repeating said writing step, and wherein the elapsed time between said writing and said repeating of said writing is at least an order of magnitude less than the time required to create a new mask.

9. The method of claim 1, wherein both said writing and said imaging are performed differently and simultaneously by different ones of said beams.

10. A method of writing resist-coated substrates using charged particle beams, comprising the actions of:
    writing multiple cut features specified by at least one design layout database onto at least one substrate;

imaging said features, said features being targeted in at least partial dependence on the design layout database;

automatically identifying one or more defects in ones of said features in at least partial dependence on said imaging and the design layout database;

automatically modifying the design layout database, in at least partial dependence on said identifying, to lower the rate of yield-reducing ones of said defects; and iteratively repeating said writing, said imaging, said identifying and said modifying using successively modified ones of the design layout database;

wherein said writing and said imaging use multiple charged particle beams produced by multiple columns that are substantially the same, different ones of said beams targeting different portions of the substrate; and wherein the stages on which the substrate is mounted during said writing and said imaging are substantially the same.

11. The method of claim 10, wherein said iteratively repeating is iterated until a desired yield rate is achieved as determined in at least partial dependence on said imaging and said identifying.

12. The method of claim 10, wherein multiple different design layout databases, based on the same functional specifications but specifying different feature layouts, are used to write multiple different substrates, wherein said writing, imaging, identifying and modifying are separately iteratively repeated on multiple different substrates using the resulting different lineages of successively modified design layout databases, and wherein one or more of the resulting yield-optimized design layout databases is used for in-line production.

13. The method of claim 10, wherein said writing writes said features onto the resist layer coated on the surface of the substrate, said resist being sensitive to charged particle beam exposure; further comprising developing said written resist to form layout features on said substrate; wherein said imaging images said layout features.

14. The method of claim 10, wherein said imaging and said identifying are each performed after both etching the substrate and developing the substrate; wherein said imaging, said identifying, and said etching are performed on at least one iteration of said repeating; and wherein said identifying after said developing designates at least some of said defects identified after said developing for imaging at a higher resolution after said repeated etching.

15. The method of claim 10, wherein successive iterations of said writing, imaging, identifying, modifying and repeating steps are performed using successive ones of said modified design layout database, whereby in successive iterations said defects are stochastically reduced.

16. The method of claim 10, wherein said identifying comprises determining locations and classifying defect types of said defects.

17. The method of claim 16, wherein said identifying further comprises classifying ones of said defects in at least partial dependence on how likely said defects are to cause yield loss caused by deviations in parametric performance or failure of device function.

18. The method of claim 16, wherein said modifying only modifies the design layout database with respect to ones of said defects of a type likely to cause yield loss.

19. The method of claim 10, wherein said charged particle beams are electron beams, said columns are miniature columns using electrostatic deflection to target the substrate, and said stages are configured to have substantially the same substrate-stage alignment mechanisms, stage positioning mechanisms, stage position accuracy, and control electronics and software.

20. The method of claim 10, wherein said modifying is performed in at least partial dependence on iterations of said identifying from prior to said repeating.

21. The method of claim 10, wherein one or more iterations of said writing are performed while varying parameters comprising at least one of beam energy, beam focus, exposure time and beam current; wherein said identifying determines which of said defects are reduced by varying said parameters; and wherein said modifying varies said parameters to reduce said defects and thereby increase yield.

22. The method of claim 10, wherein the substrate is written using optical lithography prior to writing step.

23. The method of claim 10, wherein said imaging and said identifying are performed on a substrate both after develop and after etch, and wherein one or more care areas are designated for increased-resolution after develop imaging in at least partial dependence on defects identified by said after etch identifying.

24. The method of claim 10, wherein one or more iterations of said imaging are performed while varying parameters comprising at least one of beam energy, beam focus, exposure time and beam current; wherein said identifying determines which of said varied parameters improve defect detection sensitivity; and wherein said modifying varies said parameters to enhance said defect detection sensitivity and thereby increase yield.

* * * * *